(12) United States Patent
Rose et al.

(10) Patent No.: US 6,836,372 B2
(45) Date of Patent: Dec. 28, 2004

(54) ELECTROSTATIC CORRECTOR

(75) Inventors: Harald Rose, Darmstadt (DE); Stephan Uhlemann, Heidelberg (DE); Christoph Weissbäcker, Dieburg (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 0 days.

(21) Appl. No.: 10/466,744
(22) PCT Filed: Nov. 23, 2001
(86) PCT No.: PCT/DE01/04446
§ 371 (c)(1), (2), (4) Date: Jul. 18, 2003
(87) PCT Pub. No.: WO02/058101
PCT Pub. Date: Jul. 25, 2002

(65) Prior Publication Data
US 2004/0051985 A1 Mar. 18, 2004

(30) Foreign Application Priority Data
Jan. 20, 2001 (DE) .......................... 101 02 527

(51) Int. Cl.[7] ......................... G02B 11/00; H01J 37/153; G01J 1/00
(52) U.S. Cl. .................... 359/642; 250/396 R; 356/123
(58) Field of Search .......................... 359/642; 250/311, 250/396 R, 396 ML, 398; 356/123

(56) References Cited

U.S. PATENT DOCUMENTS 5,838,011 A * 11/1998 Krijn et al. ............. 250/396 R
6,184,975 B1 * 2/2001 Henstra et al. ............. 356/123

* cited by examiner

*Primary Examiner*—Georgia Epps
*Assistant Examiner*—William Choi
(74) *Attorney, Agent, or Firm*—Edwin D. Schindler

(57) ABSTRACT

An electrostatic corrector with a rectilinear optical axis has two corrective parts, which are arranged one behind the other along the optical axis and which have respective quadrupole fields and superimposed circular lens fields. The astigmatic intermediate image of one cross-section that is created by an axis point lies in one corrective part and the astigmatic intermediate image of the other cross-section, which is perpendicular to the first cross-section, lies in the other corrective part. An object of the invention is to eliminate the chromatic aberration of particle lenses. To achieve this, an electrostatic corrector is used, which includes two corrector units having similar instrumental construction, with each of the two corrector units having input and output sides on which two additional electrostatic quadrupoles are located. The two corrector units represent the axial paths in a telescopic manner in a 1:1 representation. The two corrector units are arranged one behind the other along the optical axia and are rotated by 90° about the optical axis relative to one another.

8 Claims, 1 Drawing Sheet

ELECTROSTATIC CORRECTOR

BACKGROUND OF THE INVENTION

1. Technical Field of the Invention

Figure 1:
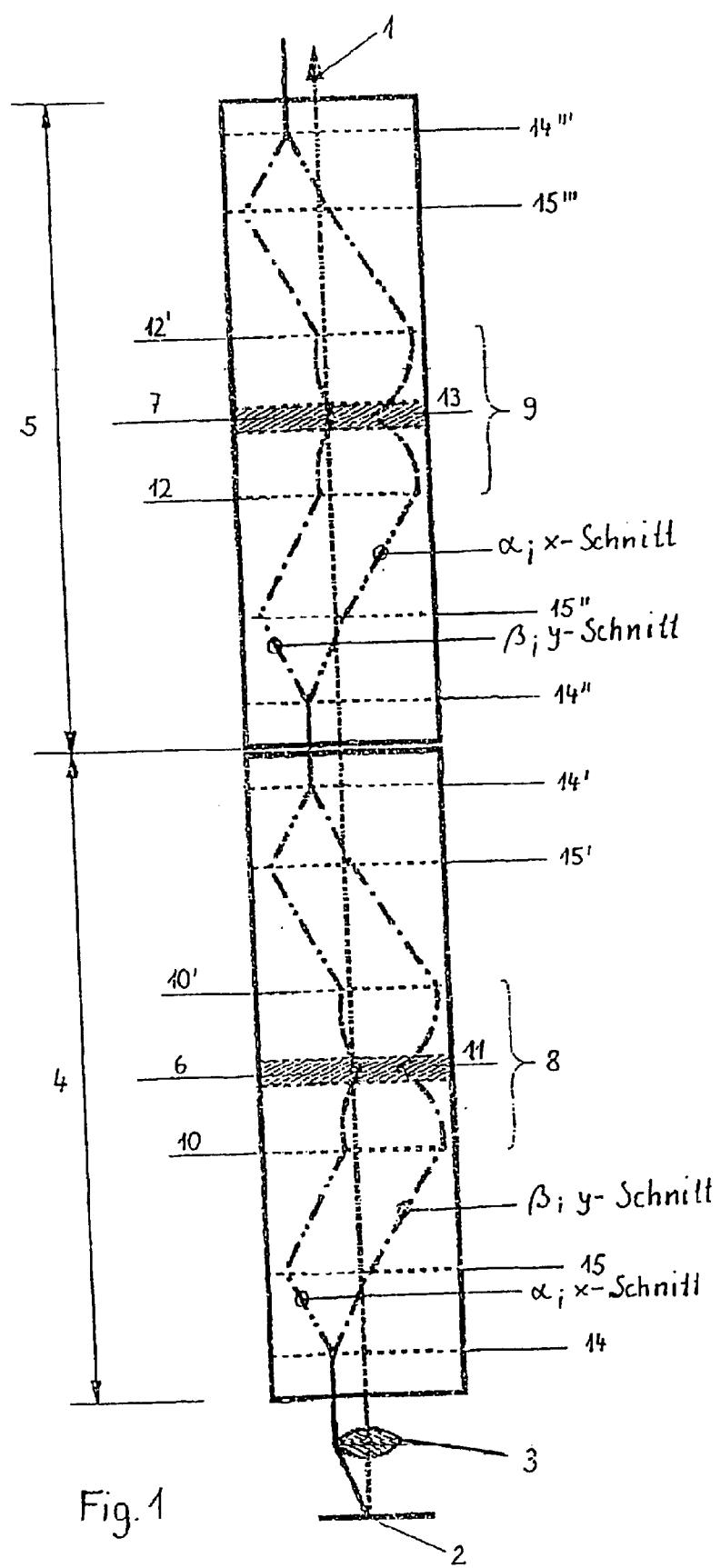

The invention relates to an electrostatic corrector comprising a rectilinear optical axis for eliminating the chromatic aberration of particle lenses comprising two corrective parts, which are arranged one behind the other along the optical axis and have in each case electrical quadrupole fields and superimposed circular lens fields, the astigmatic intermediate image of one cross-section that is created by an axis point lying in one part of the corrector and the astigmatic intermediate image of the other cross-section, which is perpendicular to said first cross-section, lying in the other part of the corrector.

Particle-optical systems, in particular electron microscopes, are suitable for imaging atomic structures. However, there is a physical limit on the resolution capacity of an optical system, which is determined by the refraction. It has the effect that two separate object points are only reproduced by the optical system as two separate points if their distance apart does is not below the minimum value of $d=0.6\,\Delta\lambda/\alpha$, where $\lambda$ is the wavelength and $\alpha$ the maximum angle of beam spread of the optical system. To image bodies of extremely small dimensions, this limit d must have the smallest possible values, that is to say the wavelength $\lambda$ of the imaging beams must be chosen small and the angle of beam spread a must be chosen large. With the changeover from the optical microscope to the electron microscope, a gain in resolution of approximately factor $10^3$ is obtained, since the wavelength is small by a factor of about $10^{-5}$, while the maximum angle of beam spread decreases by about $10^{-2}$.

However, this improvement in resolution is not sufficient to allow the resolution of atomic dimensions with the electron microscope. For a further increase in resolution capacity, it is therefore necessary to employ systems with a large angle of beam spread $\alpha$. However, this introduces the problem that image aberrations dependent on the beam spread angle come into play, which in turn reduce the resolution. Considerable efforts have been made in the past to correct these image aberrations, in particular the chromatic aberration and spherical aberration. The best successes to date have been achieved with optical systems in which, instead of rotationally symmetrical fields, multipoles, in particular quadrupoles and octopoles, are used.

2. Description of the Prior Art

In the prior art, a corrector built up from electrical and magnetic multipoles (Nucl. Instr. methods A363 (1995), p 316) is disclosed, in which, in a low-voltage scanning electron microscope, spherical and chromatic aberrations have been completely corrected. The resolution capacity achieved with this arrangement lay at a value of 2 nm, with the applied electron energy being 1 kV. However, the use of magnetic multipoles leads to the disadvantage that, because of the magnetic resonance, the adjustment of the fields can only be reproduced with difficulty.

A corrector for elimination of the chromatic aberration in both cross-sections with purely electrical fields is presented in German Patent DE 199 26 927. The corrector proposed here has two corrective parts, which are arranged one behind the other along the optical axis and have in each case electrical quadrupole fields and superimposed circular lens fields. The principal advantage of this corrector over that mentioned above is that the fields required for correction can be adjusted precisely and, in particular, reproducibly. In practice, however, a disadvantage of this design has emerged that a high resolution is only achieved in regions extremely close to the axis, so that the useful image field size is restricted to only about 20 pixels.

SUMMARY OF THE INVENTION

Against this background, the invention has set itself the object of providing a corrector for eliminating the chromatic aberration in particle lenses, which, firstly, utilises purely electrostatic fields and, secondly, offers an image field that is many times larger.

This object is achieved according to the invention in that
two corrector units are provided
the two corrector units
are designed so as to be of similar technical design
and arranged one behind the other along the optical axis
and rotated through 90 degrees about the optical axis
each corrector unit
has one of the corrective parts formed from at least
three quadrupoles
at the input and output side of which two further
electrostatic quadrupoles are arranged in each case
and the axial paths are represented telescopically with
a 1:1 representation.

The corrector according to the present invention is based on an electrostatic corrector which is known per se and comprises two corrective parts, which are arranged one behind the other along the optical axis. Each of these corrective parts has three electrical quadrupole fields and superimposed circular lens fields, the fields of the first and second corrective part being rotated relative to one another through an angle of 90 degrees about the optical axis. The mode of operation of each corrector is chosen such that the intermediate image of one cross-section generated by a point on the axis comes to lie in one corrective part, and the astigmatic intermediate image of the other cross-section, which is perpendicular to the aforesaid intermediate image, comes to lie in the other corrective part.

DETAILED DESCRIPTION OF THE INVENTION

In the present invention, the corrective parts are in each case arranged within one corrective unit, at the input and output side of which two further electrostatic quadrupoles are provided in each case The two corrective units are designed so as to be identical to one another and arranged one behind along the optical axis, the second unit being arranged so as to be rotated through 90 degrees with respect to the first. The rays emerging from an object point, after passing through the objective, thus pass through the following fields in succession:
the first corrective unit
at the input side, first the fields of two quadrupoles
lying one behind the other
then three successive quadrupoles of the first corrective
part with superimposed circular lens field
at the output side also two quadrupole fields again
the second corrective unit
at the input side, the fields of two quadrupoles lying one
behind the other
then three successive quadrupoles of the second corrective part with superimposed circular lens field
at the output side also two quadrupole fields again
the fields in the second corrective unit, by virtue of the rotation of this unit, being rotated about the optical axis relative to the fields of the first corrective unit by an angle of 90 degrees.

The ray path of the axial rays in the corrector then appears as follows:

The rays emerging from an object point on the optical axis are thus deflected by the objective toward the image point. With the entry of these rays into the corrector, the two quadrupoles arranged at the input side have the effect that the axial paths extending in the x and y cross-section respectively are deflected in different directions. The particle bundle is thereby focused in a cross-section, for example in the x cross-section, while in the other section, the y section, it is spread out, so that an astigmatic intermediate image is produced. By an appropriate choice of the strength of the electrical potentials at the two quadrupoles, this intermediate image comes to lie in the centre of the corrective part. This also expressly includes those cases in which two astigmatic intermediate images come to lie closely one behind the other in the same cross-section and in the direction of the optical axis. Instead of an astigmatic intermediate image, two closely adjacent intermediate images are thus produced. The fields of the corrective piece thereby act essentially only on the spread-out rays of the y cross-section, their path trajectory being subject to a considerable influence and experiencing a negative contribution to the chromatic aberration. In the x cross-section, the corrective fields only develop a slight effect, since the axial path extends close to the optical axis, and the corrective field's contribution to the chromatic aberration is therefore small. As the bundle of rays passes through the two further quadrupoles arranged at the output from the first corrective unit, its astigmatism is cancelled out again and its rotational symmetry is restored. The rays in the two cross-sections therefore leave the first corrective unit without splitting.

As the imaging rays pass through the second corrective unit, which is of similar design to the first, they follow the same paths, and thereby, in principle, undergo the same influence as in the first unit. Because of the rotation of the second unit with respect to the first, however, the rays of the x cross-section are spread out in this corrective unit, while the rays of the y cross-section are focused. The corrective fields in the corrector of this unit correspondingly only act on the rays in the x cross-section, while the rays lying in the y cross-section by contrast only undergo a slight effect. After passage through the two quadrupole fields arranged at the output side, the particle bundle also leaves the second corrective unit as a rotationally symmetrical bundle.

The present arrangement thus effects a change of the chromatic aberration of one section in the first corrective unit, of the chromatic aberration of the second cross-section in the second corrective unit, and therefore, overall, of the chromatic aberration of the entire ray bundle. If the potentials on the quadrupole elements of the two corrective parts are appropriately chosen, the chromatic aberrations of the objective and corrective units can be caused to compensate one another, and thereby the entire system, formed of an objective lens and corrector is free of chromatic aberrations.

Seen from the outside, the two corrective units according to the present invention behave in each case like thick circular lenses, which image the axial paths in each case telescopically in a 1:1 representation. Because of the similar design of the two corrective units, the fields correspond to one another at the input side and the multipole elements, which correspond to one another at the output side, of the two corrective units are in each case of equal magnitude. From this, it ensues in an advantageous manner that equal potentials are set at the respective, mutually corresponding quadrupoles of the two corrective units. In particular, this also results in equal contributions to the image abberation or changes to the image aberration in both cross-sections. Different setting of the corrective fields in both sections, as in known correctors, is thereby eliminated.

The decisive advantage of the corrector according to the invention, however, lies in its high resolution, in the resulting considerably increased image field size and in a reproducible setting of the corrective field strengths.

A preferred further embodiment of the electrostatic corrector according to the invention has corrector pieces, which are in each case arranged in the centre of the corrective units, the construction and fields of the corrective units being designed so as to lie mirror symmetrically to the centre plane, lying perpendicular to the optical axis, of the corrective part. By virtue of the aforementioned mirror symmetry, it follows that the input and output sides of the corrective units are mirror symmetrical to one another as regards their construction and their fields. Likewise, with the given similar construction and the mutually 90-degree rotated arrangement of the two corrective units, it follows that the fields of the two corrective units are point symmetrical with respect to the plane that lies symmetrically between them and is aligned perpendicular to the optical axis.

This double symmetry has far-reaching effects on the magnitude and nature of the image aberrations within the corrector. Primarily, this has the result that:

the axial paths extend mirror symmetrically with respect to the centre of the corrective part the field paths (extra-axial paths) extend point symmetrically with respect to the centre of the corrective part the axial paths in the centre plane between the two corrective units exchange their roles with respect to the x/y cross-section potentials of equal magnitude lie on the (total of four) quadrupoles that are arranged at the input and output sides in each case of the corrective units potentials of equal magnitude lie on the (total of four) quadrupoles that are arranged between the input and output sides in each case of the corrective units and corrective parts potentials of equal magnitude lie on the quadrupoles that lie on both sides of the centre plane of the corrective parts As a consequence of the symmetrical/antisymmetrical trajectory of the paths and of the fields, the analytical computation of the image aberration integrals is considerably simpler than with known correctors The simplification consists firstly in the fact that the integrals assume a very clearly understandable form and thereby lead to an easier understanding of the corrector in different settings. Secondly, numerous aberration integrals become zero, which means that the image aberrations corresponding to these integrals do not occur at all in the proposed arrangement. Thus, because of the symmetry between the corrective units, the combined aberrations between these units are eliminated. Furthermore, all extra-axial aberrations that depend on odd powers of the axial spacing disappear. The advantageous consequence of this is that the resolution of the particle-optical system is also essentially improved outside the range close to the axis. Where the corrector according to the invention is used in an electron microscope, the improvement is expressed in a useful image size comprising approximately 1000 pixels.

The above-described symmetry also leads to a considerable simplification in adjusting the fields required for correction. By the setting of equal potentials at the various quadrupole elements of the corrector, the inherently wide variety of adjustment possibilities of a corrector is considerably reduced. This considerably simplifies the execution of the corrector. An advantageous consequence of the restricted number of parameters is also a reduction of the equipment necessary for voltage supply. As has been found in practice, the corrector according to the present invention, by virtue of its high symmetry, also requires a considerably less mechanical production accuracy. The production costs of the present corrector are thus considerably lower than those of known correctors.

The proposed corrector is not only suitable for correction of chromatic aberration but also for correction of spherical aberration. To this end, octopole fields are used, i.e. fields with a symmetry that is fourfold in an azimuthal direction. In a preferred embodiment of the corrector, three octopoles generating such fields are provided, which are in each case arranged in the centre plane of the corrective parts and in the plane which lies in the centre between the two corrective units. If the electric potentials applied to the octopoles are appropriately set, the spherical aberrations of the objective and corrective units can be caused to compensate one another, and thereby the entire system, formed of an objective lens and corrector, is free of spherical aberrations.

According to a feature of the invention, the octopole fields can also be superimposed on the quadrupole fields. In the present corrector, this is used in that the octopole fields used for correction of the spherical aberration are superimposed on the fields of the quadrupoles arranged within the corrective parts. In a further embodiment of the invention an octopole in each case is superimposed on the quadrupoles lying at the input and output sides of the corrective units. This embodiment also allows a correction of the image field curvature.

In a preferred embodiment of the corrector according to the invention, multipole elements are used, which generate both quadrupole fields and octopole fields. By this means, the clarity of the corrector is improved and the costs for its production are substantially reduced.

BRIEF DESCRIPTION OF THE DRAWING FIGURE

Further details, features and advantages of the invention can be taken from the following descriptive part, in which the ray path and the function of the corrector are explained in greater detail with reference to an accompanying drawing; The FIGURE shows a longitudinal section through a corrector in a greatly simplified representation.

DETAILED DESCRIPTION OF THE DRAWING FIGURE

In FIG. 1, the optical axis of the arrangement is denoted by the reference character 1. The ray path through the corrector is presented by means of the paraxial fundamental paths ▽ and ®, which start from an object point 2 lying on the axis and are deflected by means of the objective lens 3 which imparts a chromatic aberration. The corrector, in its basic construction, consists of two similarly designed corrective units 4 and 5, which are designed so as to be mirror symmetrical with respect to their centre planes 6 and 7 and are rotated through 90 degrees with respect to one another about the optical axis. In the centre of the corrector units, one corrective part 8 and 9 in each case is provided, which in turn are built up of three quadrupoles 10, 11, 10' and 12, 13, 12'. Because of the mirror symmetry, the quadrupoles 10, 10' and 12, 12' are similar to one another and correspondingly generate similar fields. At the input and output sides of the corrective unit, two further quadrupoles 14, 15, 14', 15', 14", 15", 14'", 15'" in each case are provided. The identification by the same numbers here is intended to indicate that these quadrupoles are also designed so as to be the same as one another.

With the entry of these rays into the corrector, the two quadrupoles 14, 15 arranged at the input side have the effect that the axial paths α and β extending in the x and y section respectively are deflected in different directions. The particle bundle is thereby focused in a cross-section, for example in the x cross-section, while in the other cross-section, the y cross-section, it is spread out, so that an astigmatic intermediate image is produced. By an appropriate choice of the strength of the electrical potentials at the two quadrupoles, 14, 15, this intermediate image comes to lie in the centre, in the case of a plurality of astigmatic intermediate images in the same cross-section symmetrically to the centre of the corrective piece 8. This corrective part effects a change and, with appropriate choice of the quadrupole field strengths, an elimination of the chromatic aberration in the y cross-section, that is to say in that cross-section in which the β path remote from the axis extends. In the x cross-section, on the other hand, the corrective fields only develop a slight effect, since the a path extends close to the optical axis, and the corrective field's contribution to the chromatic aberration is therefore small. The two quadrupoles 14', 15' arranged at the output from the first corrective unit serve to restore the rotational symmetry of the ray bundle.

As the particle bundle passes through the second corrective unit, which is of similar design to the first, it, in principle, undergoes the same influence as in the first corrective unit. The two quadrupoles 14", 15" thus lead to a splitting of a and β path, and the quadrupoles 12, 13, 12' of the corrective part 9 lead to a chromatic aberration correction. By virtue of the rotation of the second corrective unit 5 relative to the first 4, the fields of the corrective part 9, however, act on the a path extending in the x cross-section and therefore effect a correction of the chromatic aberration in this cross-section. After passage through the two quadrupole fields 14'", 15'" arranged at the output side, the particle bundle also leaves the second corrective unit as a rotationally symmetrical bundle.

The present arrangement thus effects a change or elimination of the chromatic aberration of a cross-section in each case in each corrective unit, and therefore, overall, of the chromatic aberration of the entire ray bundle.

What is claimed is:

1. An electrostatic corrector, comprising:
   a rectilinear optical axis for eliminating chromatic aberration of particle lenses having a first corrective part and a second corrective part, said first corrective part being arranged behind said second corrective part along said rectilinear optical axis with said first corrective part and said second corrective part each having electrical quadrupole fields and superimposed circular lens fields;
   an astigmatic intermediate image of a first cross-section created by an axis point lying in a first part of said electrostatic corrector and an astigmatic intermediate image of a second cross-section lying in a second part of said electrostatic corrector, said second cross-section being perpendicular to said first cross-section;
   a first corrector unit having said first corrective part formed from at least three quadrupoles, said first corrector unit having an input side and an output side at which two additional electrostatic quadrupoles are arranged at each of said input side and said output side of said first corrector unit, and with axial paths being telescopically represented with a 1:1 representation; and, a second corrector unit having said second corrective part formed from at least three quadrupoles, said second corrector unit having an input side and an output side at which two additional electrostatic quadrupoles are arranged at each of said input side and said output side of said second corrector unit, and with axial paths being telescopically represented with a 1:1 representation, said first corrector unit and said second corrector unit being of substantially similar construction with said first corrector unit arranged behind said second corrector unit along said rectilinear optical axis, with said first corrector unit and said second corrector unit rotated through 90° about said rectilinear optical axis.

2. The electrostatic corrector according to claim 1, wherein said first corrective part is centrally arranged in said first corrector unit and said second corrective part is centrally arranged in said second corrector unit, each of said first corrector unit and said second corrector unit lying mirror symmetrically to a center plane of said first corrective part and said second corrective part, respectively, with said first corrector unit and said second corrector unit lying perpendicularly to the rectilinear optical axis.

3. The electrostatic corrector according to claim 1, wherein said electrical quadrupole fields and said superimposed circular lens fields of said first corrector unit and said second corrector unit are point symmetrical relative to a plane lying symmetrically between said first corrector unit and said second corrector unit and perpendicularly to the rectilinear optical axis.

4. The electrostatic corrector according to claim 1, further comprising one octopole in a center plane of said first corrective part, one octopole in a center plane of said second corrective part and one octopole in a plane lying centrally between said first corrector unit and said second corrector unit.

5. The electrostatic corrector according to claim 1, further comprising superimposition of an octopole field on at least one of said electrical quadrupole fields of each of said first corrective part and said second corrective part.

6. The electrostatic corrector according to claim 5, wherein said superimposition of said octopole field on at least one of said electrical quadrupole fields of each of said first corrective part and said second corrective part takes place in at least one of said electrical quadrupole fields of each of said first corrective part and said second corrective part.

7. The electrostatic corrector according to claim 5, wherein said superimposition of said octopole field on at least one of said electrical quadrupole fields of each of said first corrective part and said second corrective part takes place in at least one of said electrical quadrupole fields of each of said input side and said output side of each of said first corrector unit and said second corrector unit.

8. The electrostatic corrector according to claim 1, further comprising a multipole element generating both an electrical quadrupole field and an octopole field.

* * * * *